(12) United States Patent
Oakley

(10) Patent No.: US 7,295,018 B2
(45) Date of Patent: Nov. 13, 2007

(54) CORRECTION OF LOSS AND DISPERSION IN CABLE FAULT MEASUREMENTS

(75) Inventor: Peter Q. Oakley, Langley, WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 10/822,965

(22) Filed: Apr. 12, 2004

(65) Prior Publication Data

US 2005/0225329 A1 Oct. 13, 2005

(51) Int. Cl.
*G01R 31/11* (2006.01)
(52) U.S. Cl. .................... 324/533; 324/616
(58) Field of Classification Search ............. 324/533, 324/534, 539, 543, 616; 702/57, 58, 77
See application file for complete search history.

(56) References Cited

U.S. PATENT DOCUMENTS

| | | | |
|---|---|---|---|
| 5,502,391 A | 3/1996 | Sciacero | 324/628 |
| 5,530,367 A | 6/1996 | Bottman | 324/616 |
| 5,570,029 A | 10/1996 | Bottman | 324/628 |
| 5,698,985 A | 12/1997 | Bottman | 324/628 |
| 6,433,558 B1 | 8/2002 | Sciacero | 324/628 |
| 6,437,578 B1 | 8/2002 | Gumm | 324/533 |
| 6,745,137 B2 * | 6/2004 | Krishnamachari et al. | 702/57 |

FOREIGN PATENT DOCUMENTS

WO 2004-005947 1/2004

* cited by examiner

*Primary Examiner*—Anjan Deb
*Assistant Examiner*—John Zhu
(74) *Attorney, Agent, or Firm*—Richard A. Koske; George T. Noe; James H. Walters

(57) ABSTRACT

A method of correcting distortions resulting from loss and dispersion in cable fault measurements. A cable is measured in the frequency domain to obtain a reflected response. Fractional sinusoidal components of the reflected response having attenuated amplitude and delayed phase values at points defining the junctures of adjacent equal predetermined lengths are collected and normalized. Then the fractional sinusoidal components of the reflected response are extracted from normalized sum by mathematically calculating the real value at each point, thereby removing all loss and dispersion distortion components.

5 Claims, 3 Drawing Sheets

PULSE-BASED INSTRUMENT

FREQUENCY-BASED INSTRUMENT

CORRECTION OF LOSS AND DISPERSION IN CABLE FAULT MEASUREMENTS

BACKGROUND OF THE INVENTION

This invention relates generally to cable fault measurements, and in particular to correction of loss and dispersion in cable fault measurements.

In testing and troubleshooting electrical cables, which may be either single-wire cables or twisted-wire pairs, a typical test involves using test instruments that transmit stimulus signals into one end of a cable and receive and measure any reflections that return. Both time-domain reflectometry (TDR) and time-domain crosstalk (TDX) measurements are subject to two major types of distortion. One is attenuation distortion and the other is dispersion distortion.

Attenuation distortion is due to losses in a cable. That is, energy is lost as a stimulus signal propagates down a cable under test and then is reflected back to the test instrument, with the result being that received signals become smaller in magnitude to the point they may no longer be discernible.

One prior art method of correcting attenuation distortion is disclosed in U.S. Pat. No. 5,698,985 to Jeffrey S. Bottman, where a reflected response is scaled in the time domain by multiplying the response by a weighting function to compensate for attenuation. That is, the attenuated signals are "boosted" or amplified proportionately over the length of the cable by multiplying each point of the response by a predetermined weighting function. Because the weighting function corrects only for attenuation and not for dispersion, this method is prone to inaccuracies.

Another prior art method of correcting attenuation distortion is disclosed in U.S. Pat. No. 6,437,578 to Linley F. Gumm, wherein cable loss is corrected on a point-by-point basis wherein for each point several Fourier transforms are performed to shift back and forth between the frequency and time domains as calculations are being performed. That is, data acquired in the frequency domain is Fourier transformed to the time domain to provide an impulse response for the cable. Then each point is transformed back to the frequency domain while correcting each point based on distance and frequency. The corrected data is then transformed back to the time domain so that the correction can be observed. However, for a record length of only 2048 points, 4.2 million calculations are required. Further, this method also corrects only for attenuation, and not for dispersion.

The second type of distortion, dispersion distortion, results from the fact that the different frequency components of the stimulus signals and reflections propagate through the cable at different speeds. Dispersion distortion causes reflected pulses to become wider, or "smeared."

Both attenuation distortion and dispersion distortion are inherent in the characteristics of cables, and both are present at the same time. The effect of these distortions is reduce the instrument operator's ability to recognize "events" or faults in the cable. The pulse returned from an event could be so small that it could not be discerned. Further, the smearing of the responses from closely spaced multiple events could make their returned pulses overlap and appear to be from a single event.

It would be desirable to provide a method of reliably and quickly correcting both attenuation distortion and dispersion distortion.

SUMMARY OF THE INVENTION

In accordance with the present invention, a method is provided for correction of loss and dispersion in cable fault measurements.

The loss and dispersion correction method of the present invention is useful in providing clear and accurate reflected responses in both pulse-based cable test instruments and frequency-based cable test instruments.

A cable is measured in the frequency domain to obtain a reflected response. In the case of a pulse-based instrument, a Fourier transform is used to decompose a sent pulse into its sinusoidal components. A superposition of fractional sinusoidal components of the reflected response having attenuated amplitude and delayed phase values at points defining the junctures of adjacent equal predetermined lengths along the cable are collected and normalized. Then the fractional sinusoidal components of the reflected response are extracted from normalized superposition by mathematically calculating the real value at each point, thereby removing all loss and dispersion distortion components.

Other objects, features, and advantages of the present invention will become obvious to those having ordinary skill in the art upon a reading of the following description when taken in conjunction with the accompanying drawings.

DETAILED DESCRIPTION OF THE INVENTION

Figure 1A:
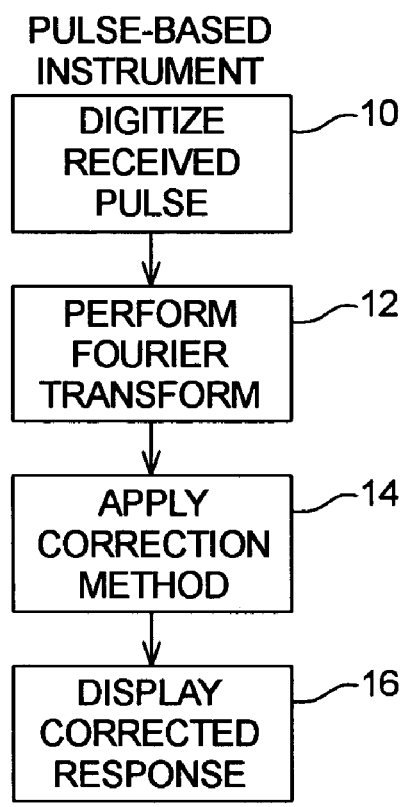
FIGS. 1A and 1B show a flow chart comparison of pulse-based and frequency-based cable testing instruments for carrying out the correction method of the present invention.
Figure 1B:
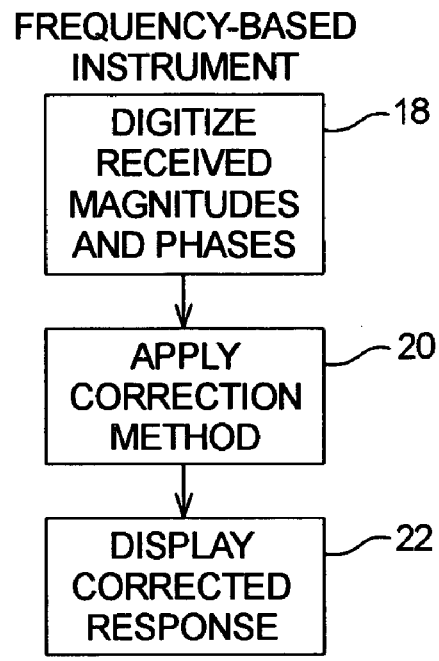

FIGS. 1A and 1B show a flow chart comparison of pulse-based cable test instruments and frequency-based instruments for carrying out the correction method of the present invention. Considering first FIG. 1A, a pulse-based test instrument sends a short-duration pulse into a cable under test and receives a reflected response in the time domain. In block 10, the reflected response received from the cable is "digitized," that is, the response is sampled at a predetermined clock rate and converted to digital representations that can then be processed. In block 12, a Fourier transform transforms the digitized response from the time domain to the frequency domain. In block 14, the correction method of the present invention is applied. In block 16, the corrected response is displayed.

In FIG. 1B, a frequency-based test instrument synthesizes a virtual stimulus pulse by sending a series of sinusoidal frequencies, or "tones," into a cable under test. Reflected responses are received in the frequency domain. In block 18, the reflected responses are digitized and assembled into magnitudes and phases. In block 20, the correction method of the present invention is applied. In block 22, the corrected response is displayed.

Both pulse-based cable test instruments and frequency-based cable test instruments are well known to those skilled in the art. Examples of pulse-based instruments are disclosed in U.S. Pat. No. 5,530,367 issued Jun. 25, 1996, to Jeffrey S. Bottman, and U.S. Pat. No. 5,570,029 issued Oct. 29, 1996, to Jeffrey S. Bottman et al. Examples of swept-frequency instruments are disclosed in U.S. Pat. No. 5,502,391 issued Mar. 26, 1996, to James R. Sciacero, and U.S. Pat. No. 6,433,558 issued Aug. 13, 2002, to James R. Sciacero et al. It should be pointed out that both types of instruments are capable of both TDR (time domain reflectometry) and TDX (time domain crosstalk) measurements. For a TDR measurement, a stimulus signal is sent out on a cable, and a reflection returns on the same cable. For a TDX measurement, the stimulus signal is sent out on one cable, and a reflection returns on a different cable. A cable may be either a coaxial cable having a single-wire conductor and an outer conductor separated by a dielectric, or a twisted pair of wires such as telephone cables. However, transmitted pulses experience the same distortions for each type of measurement, and in each type of cable. Accordingly, the principles for detecting faults and correcting them are the same for both types of measurement.

Figure 2A:
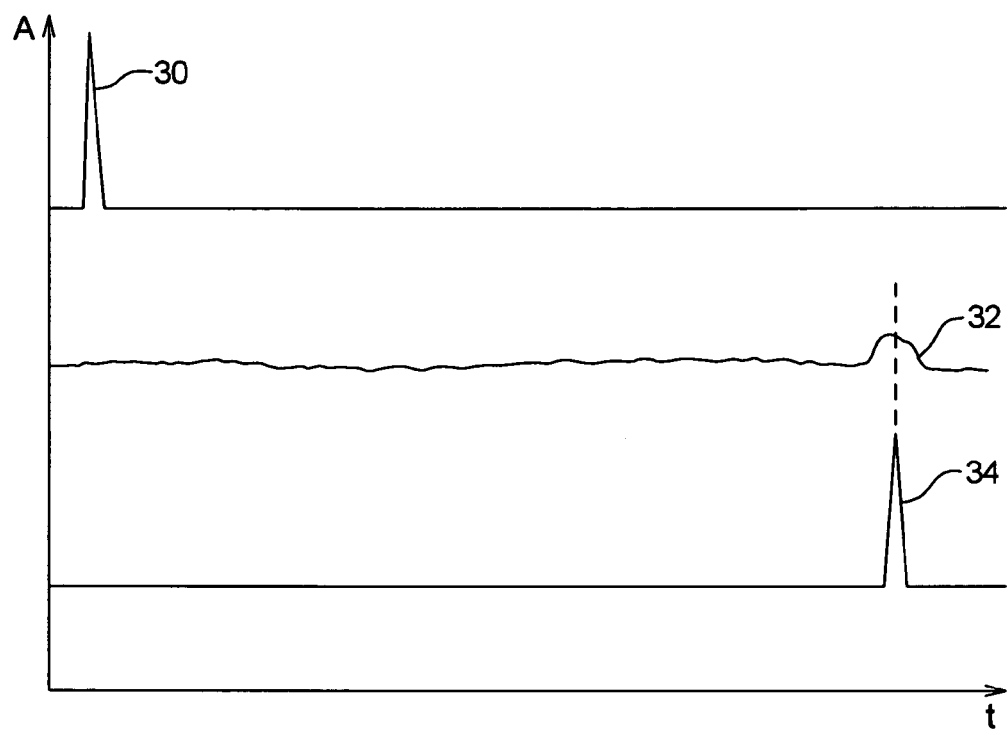
FIGS. 2A and 2B are graphic displays of waveforms showing a stimulus pulse and its response from a single event and from multiple close events, respectively, and corrected responses for respective single and multiple events in accordance with the present invention.
Figure 2B:
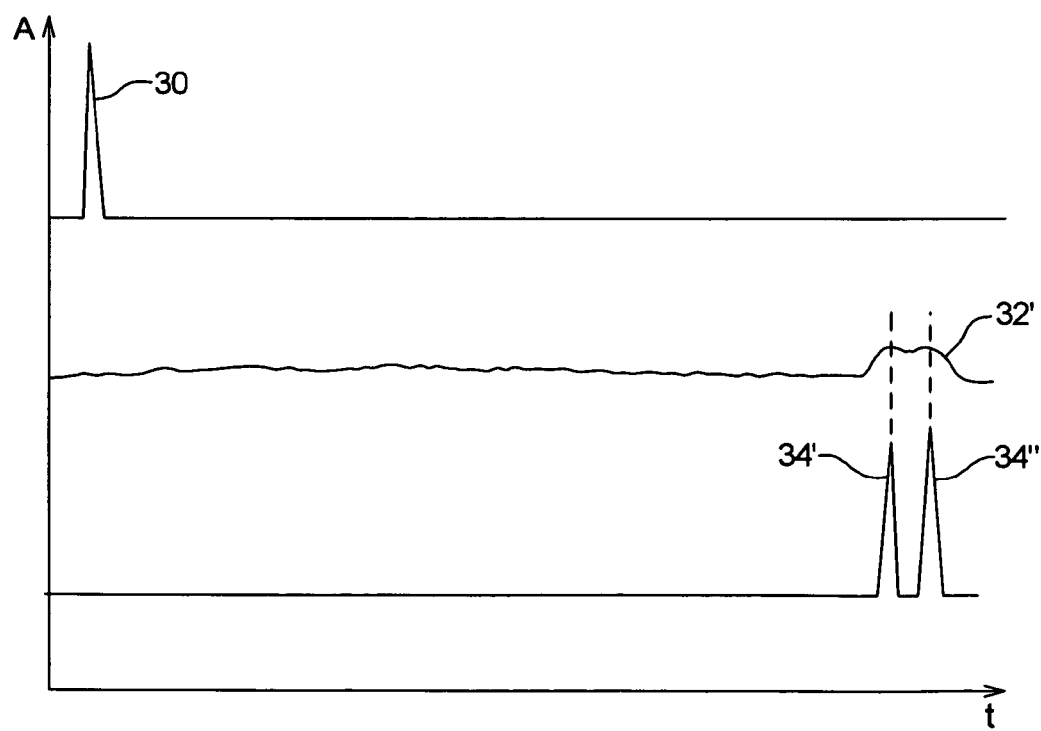

Referring to FIGS. 2A and 2B of the drawings, there are shown amplitude versus time graphic displays of waveforms for single event and multiple event cable testing situations, respectively. In FIG. 2A, a stimulus pulse 30, which may be either a direct pulse or a synthesized one as discussed above, is sent into a cable. A reflected response 32 is received, but because it exhibits both attenuation and dispersion distortions, it is difficult to determined exactly what it represents. After the correction method of present invention is applied, corrected pulse 34 is presented, clearly showing a single fault event at determinable location in the cable. In FIG. 2B, stimulus pulse 30 is again sent into the cable, and a distorted reflected response 32' is received. This time, however, after the correction of the present invention is applied, multiple closely space fault events 34' and 34" are discerned. It can be seen that if the reflected response 32' in FIG. 2B were to be corrected only for attenuation distortion, the fact that there are two closely spaced events would be missed.

The method of correcting for loss and dispersion in accordance with the present invention is based on operating on frequency-domain measurements as input to the processing stage, where distortions are mathematically removed. A transmitted pulse in a pulse-based instrument can be decomposed into its sinusoidal components by a Fourier transform. After this transformation, each sent sinusoidal frequency component is investigated as it propagates along the cable. If the instrument is a frequency-based instrument, the transmitted tones are already in the frequency domain.

A look at the physics of what is taking place in a cable would be helpful in understanding the correction method of the present invention. The cable has a loss in nepers per unit length, and this loss is designated by alpha ($\alpha$), which is also known as the attenuation constant. The cable also induces a phase shift in radians per unit length in a propagating sinusoid, and this phase shift is designated by beta ($\beta$), which is also known as the phase constant. The parameters $\alpha$ and $\beta$ are characteristics of a particular type of cable and can be known in advance.

If a transmitted sinusoid signal (or Fourier transformed pulse) is characterized by its initial magnitude and phase as a complex number and designated by the function $X(f)$, where f is the frequency, then the attenuated and shifted sinusoid signal at a location at any point along the cable can be expressed as $X(f)e^{-(\alpha+j\beta)n}$, where j is the square root of $-1$ (an imaginary number) and n is the number of multiples of unit length that the sinusoid signal has propagated along the cable. The cable parameters $\alpha$ and $\beta$ are functions of frequency, so another way to write the foregoing expression is $X(f)e^{-(\alpha(f)+j\beta(f))n}$. The complex quantity $\alpha+j\beta$, which is recognized mathematically as containing a real part and an imaginary part, is also designated by a lower-case gamma ($\gamma$), and is called the propagation constant.

Signals having different frequencies travel at different speeds along a cable. The nominal velocity of propagation is expressed as a fraction of the speed of light in a vacuum. Consider modeling the cable by dividing it into a series of small, equal and discrete lengths. Each length is equal to the unit length associated with parameters $\alpha$, $\beta$, and $\gamma$. This length is chosen to be the distance the signal travels along the cable during one period of the highest tone or probing frequency sent into the cable. For example, if the highest frequency transmitted into the cable by the test instrument is 100 MHz, the length is chosen to be the distance the signal travels in 10 nanoseconds. Reflected fault events are modeled as coming only from points that are the junctures of adjacent lengths.

Figure 3:
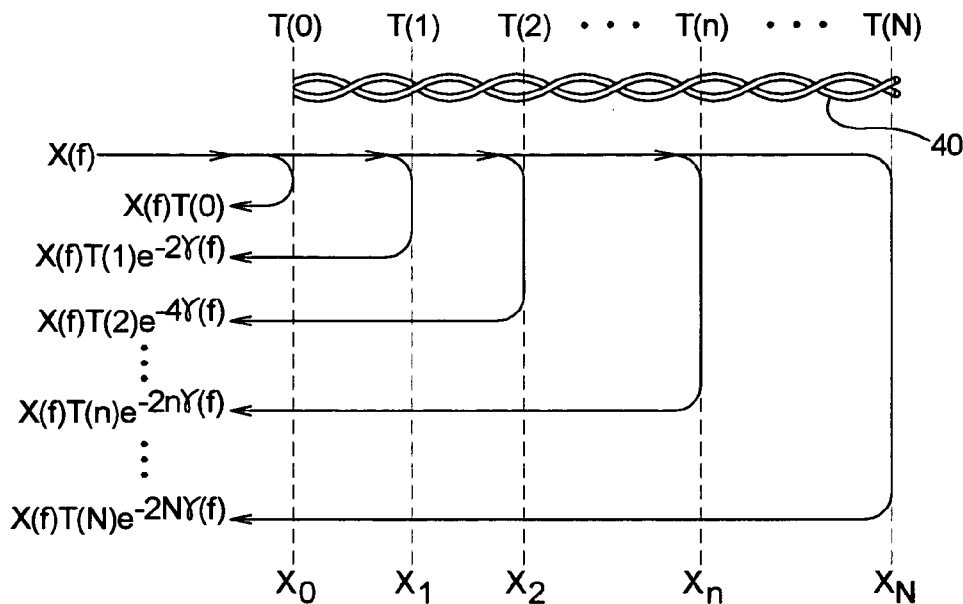
FIG. 3 is a mathematic model illustrating calculation of reflected points along a cable.

Refer to FIG. 3, which is a mathematic model illustrating calculation of reflected points along a cable 40, which in this model is a twisted pair of wires. The junction points between lengths are designated $x_0$ through $x_n$. A point $x_N$ represents the end of the cable. The size of the reflected fault, which includes crosstalk, at each point $x_{0,\ldots,n}$ is designated by a function $\Gamma(x)$, where $\Gamma$ (upper-case gamma) is the reflection coefficient. Note that if the functions $\Gamma(x)$ can be extracted one at a time, a time domain sequence results. As shown in FIG. 3, $\Gamma(0)$ is associated with point $x_0$, $\Gamma(1)$ with $x_1$, When the sinusoid signal transmitted from the test instrument arrives at an event point x, the sinusoidal fraction reflected back toward the instrument is $\Gamma(x)$. As the reflected response travels back to the instrument, it is again attenuated and phase shifted, so the complete response returned from each point x is expressed as $X(f)\Gamma(x)e^{-2x\gamma(f)}$.

From inspection of FIG. 3, it can be seen that the reflected sinusoidal fractions are returned to the test instrument together. These reflected sinusoidal fractions are superposed as a naturally-occurring phenomenon. The result measured by the test instrument is the superposition, or sum, designated as $Y(f)$ of all attenuated and phase shifted fractions. The superposition function $Y(f)$ can be normalized by dividing by the known transmitted sinusoid signal $X(f)$ to define normalized function $R(f)$. That is, $$R(f)=Y(f)/X(f)=[\Gamma(0)+\Gamma(1)e^{-2\gamma(f)}+\Gamma(2)e^{-4\gamma(f)}+\ldots\gamma(n)e^{-2n\gamma(f)}+\ldots\Gamma(N)e^{-2N\gamma(f)}].$$

The next step in the process is to extract the fractions $\Gamma(x)$ from the normalized function $R(f)$. Note that $\Gamma(0)$ is the first element in the time domain sequence $\Gamma(x)$, and it is unattenuated and undelayed because the transmitted signal has not traveled any distance into the cable, and so $\Gamma(0)$ is not multiplied by any exponential term of $\gamma(f)$. The conversion of the frequency domain sequence $R(f)$ to the time domain point $\Gamma(0)$ could be performed using an inverse Fourier transform, but there is a much simpler way to get just the first term $\Gamma(0)$. It is well known that the first term of the output of a discrete Fourier transform (DFT), whether a forward or inverse DFT, is simply the sum of the real parts of the DFT input sequence. Thus, the value $\Gamma(0)$ at point $x_0$ is $$\Gamma(0) = \sum_{f=0}^{f_{MAX}} \text{Re}[R(f)].$$

The value $\Gamma(1)$ at point $x_1$ is determined by first multiplying $R(f)$ by the known exponential of the propagation constant $e^{2\gamma(f)}$ as follows:

$$R(f)e^{2\gamma(f)} = [\Gamma(0)e^{2\gamma(f)} + \Gamma(1) + \Gamma(2)e^{-2\gamma(f)} + \ldots \Gamma(n)e^{-2(n-1)\gamma(f)} + \ldots \Gamma(N)e^{-2(N-1)\gamma(f)}].$$

Now it can be seen by inspection that the term $\Gamma(1)$ is unattenuated and undelayed because it is not multiplied by any exponential term of $\gamma(f)$. Accordingly, the value $\Gamma(1)$ at point $x_1$ may be calculated as follows:

$$\Gamma(1) = \sum_{f=0}^{f_{MAX}} \text{Re}[R(f)e^{2\gamma(f)}].$$

The value of $\Gamma(2)$ at point $x_2$ is calculated as follows:

$$\Gamma(2) = \sum_{f=0}^{f_{MAX}} \text{Re}[R(f)e^{4\gamma(f)}].$$

Likewise, the values $\Gamma(3)$ through $\Gamma(N)$ at points $x_3$ through $x_N$ can be calculated, with final value $\Gamma(N)$ at point $x_N$ being:

$$\Gamma(N) = \sum_{f=0}^{f_{MAX}} \text{Re}[R(f)e^{2N\gamma(f)}].$$

After all the values of $\Gamma(x)$ have been calculated, they may be plotted as a graphic time domain display such as the corrected waveforms shown in FIGS. 2A and 2B.

Figure 4:
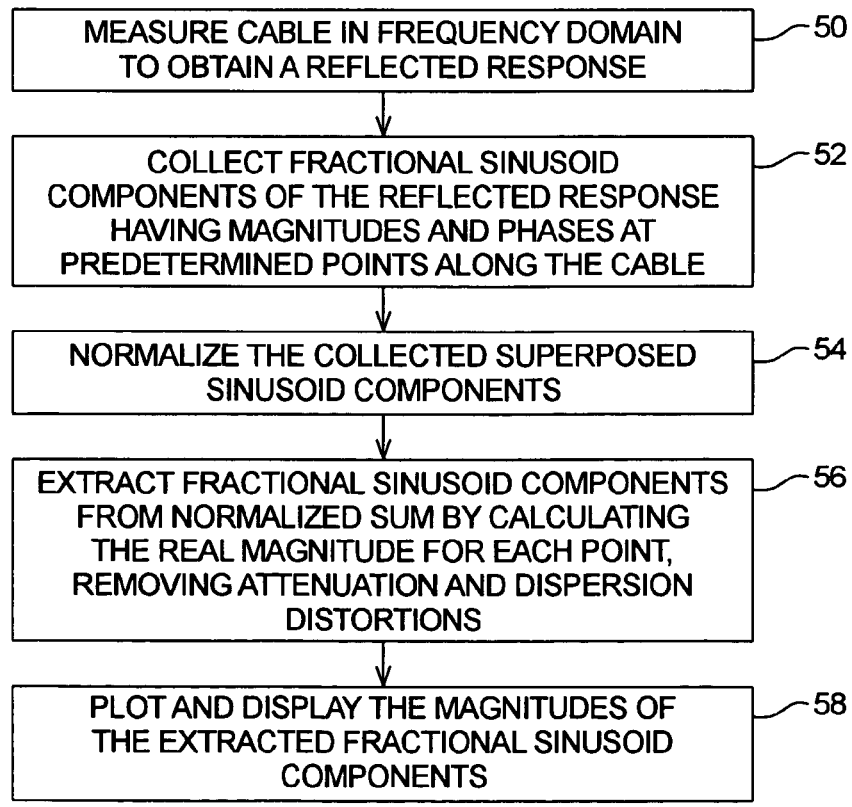
FIG. 4 is a flow chart diagram of the loss and dispersion distortion correction method in accordance with the present invention.

FIG. 4 is a flow chart diagram summarizing the loss and dispersion distortion correction method in accordance with the present invention. In step 50, the cable is measured in the frequency domain to obtain a reflected response. In step 52, fractional sinusoidal components of the reflected response having attenuated amplitude and delayed phase values at points defining the junctures of adjacent equal predetermined lengths are collected together to provide a superposed sum $Y(f)$. In step 54, the sum $Y(f)$ is divided by transmitted function $X(f)$ to provide a normalized sum $R(f)$ of reflected points. In step 56, the fractional sinusoidal components $\Gamma(x)$ of the reflected response are extracted from $R(f)$ for each point by mathematically calculating the real value at each point, thereby eliminating all distortion components. In step 58, the magnitude values of the extracted fractional sinusoidal components are plotted on an amplitude versus time (or cable length) graph.

While I have shown and described the preferred embodiment of my invention, it will be apparent to those skilled in the art that many changes and modifications may be made without departing from my invention in its broader aspects. It is therefore contemplated that the appended claims will cover all such changes and modifications as fall within the true scope of the invention.

What I claim as my invention is:

1. A method of correcting loss and dispersion distortions in cable measurements, comprising the steps of:
   (a) measuring said cable in a frequency domain to obtain a reflected response of a transmitted signal;
   (b) collecting a series of fractional sinusoid components of said reflected response from predetermined points along said cable to provide a superposed function;
   (c) dividing said superposed function by a sent signal function to provide a normalized function; and
   (d) extracting from said normalized function said fractional sinusoid components by calculating a real value at each of said predetermined points thereby removing attenuation distortion and dispersion distortion.

2. A method of correcting loss and dispersion distortions in cable measurements in accordance with claim 1, further comprising the step of displaying a plot of said extracted fractional sinusoid components.

3. A method of correcting loss and dispersion distortions in cable measurements in accordance with claim 1 wherein said predetermined points along said cable are determined in accordance with the period of a maximum probing frequency.

4. A method of correcting loss and dispersion distortions in cable measurements in accordance with claim 3 wherein said predetermined points along said cable are determined in accordance with the period of a maximum probing frequency such that distance between said predetermined points is chosen to be the distance the signal travels along the cable during one period of the said maximum probing frequency.

5. A method of correcting loss and dispersion distortions in cable measurements, comprising the steps of:
   transmitting a test signal into said cable;
   measuring said cable in a frequency domain to obtain a reflected response of the transmitted test signal;
   collecting a series of fractional sinusoid components of said reflected response from predetermined points along said cable to provide a superposed function, wherein said predetermined points are chosen such that a distance between ones of said predetermined points is chosen to be substantially the distance the test signal travels along the cable during one period of a maximum probing frequency of the test signal;
   dividing said superposed function by a function of the test signal to provide a normalized function;
   extracting from said normalized function said fractional sinusoid components by calculating a real value at each of said predetermined points thereby removing attenuation distortion and dispersion distortion; and
   displaying a plot of said extracted fractional sinusoid components to thereby provide a representation of measurements with attenuation distortion and dispersion distortion removed.

* * * * *